United States Patent [19]

Kosugi

[11] 4,101,853

[45] Jul. 18, 1978

[54] FREQUENCY SAMPLING FILTER

[75] Inventor: Hiroshi Kosugi, Yokohama, Japan

[73] Assignee: Hitachi, Ltd., Japan

[21] Appl. No.: 721,408

[22] Filed: Sep. 8, 1976

[30] Foreign Application Priority Data

Sep. 12, 1975 [JP] Japan .............................. 50-109989

[51] Int. Cl.$^2$ ....................... H03H 7/08; H03H 7/14; H03H 7/30

[52] U.S. Cl. .................................. 333/70 R; 333/29; 333/76

[58] Field of Search ................. 333/70 R, 70 T, 70 A, 333/18, 28 R, 29, 76, 73 R, 73 W; 328/165, 167; 235/181; 364/825, 724, 111, 819

[56] References Cited

U.S. PATENT DOCUMENTS

| | | | |
|---|---|---|---|
| 2,716,733 | 8/1955 | Roark | 333/28 R |
| 3,026,475 | 3/1962 | Applebaum | 324/77 |
| 3,135,932 | 6/1964 | Bangert | 333/29 |
| 3,336,539 | 8/1967 | Kwartiroff et al. | 333/18 |
| 3,568,107 | 3/1971 | Haggarty | 333/29 X |
| 3,657,669 | 4/1972 | Proakis | 333/70 T X |
| 3,858,240 | 12/1974 | Golding et al. | 333/28 R |

OTHER PUBLICATIONS

Rader et al.,—"Digital Filter Design Techniques in the Frequency Domain" in Proceedings of the IEEE, vol. 55, No. 2, Feb. 1967; pp. 149–171.

*Primary Examiner*—Craig E. Church
*Assistant Examiner*—Marvin Nussbaum
*Attorney, Agent, or Firm*—Craig & Antonelli

[57] ABSTRACT

In accordance with the present invention, there is provided an economical and compact frequency sampling filter comprising a comb filter and resonators, in which the difference between the output of a frequency sampling filter of the bandpass type or the low-pass type, or the bandstop type or the high-pass type and the output of a circuit having the same gain as that at each sampling point in the pass band of said filter and having a similarly varying phase to that in the pass band is obtained.

8 Claims, 16 Drawing Figures

FIG. 6(a) COMPLEX RESONATOR
PRIOR ART
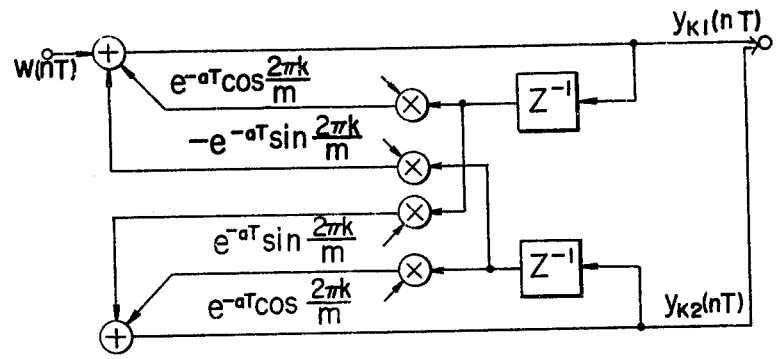
FIG. 6(b) ENTIRE CONSTITUTION
PRIOR ART
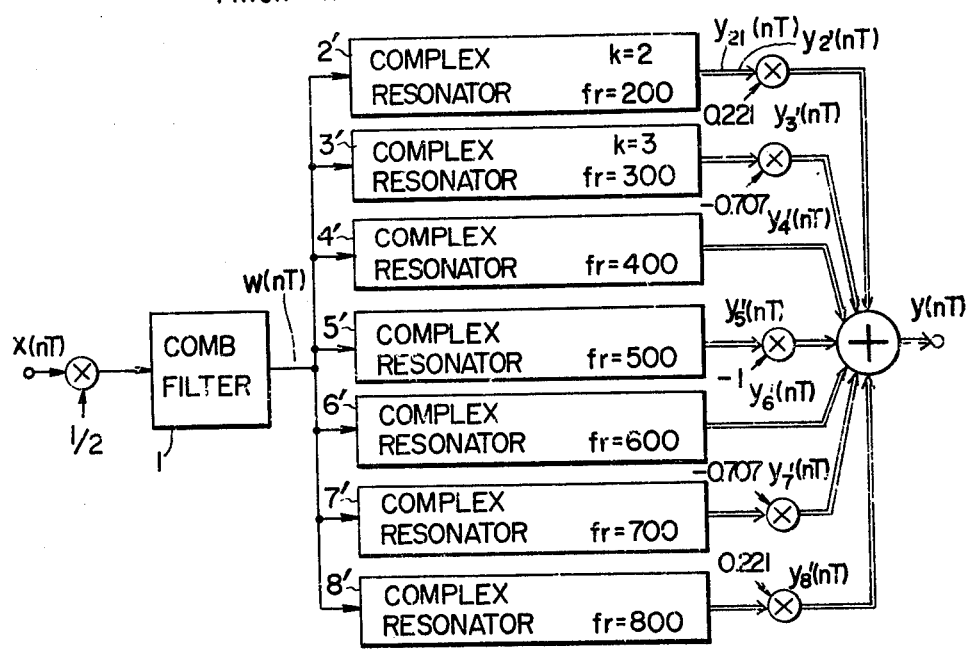

FIG. 8(a) COMB FILTER
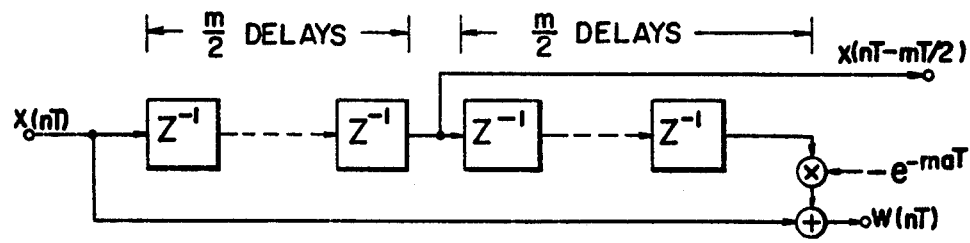
FIG. 8(b) ENTIRE CONSTITUTION
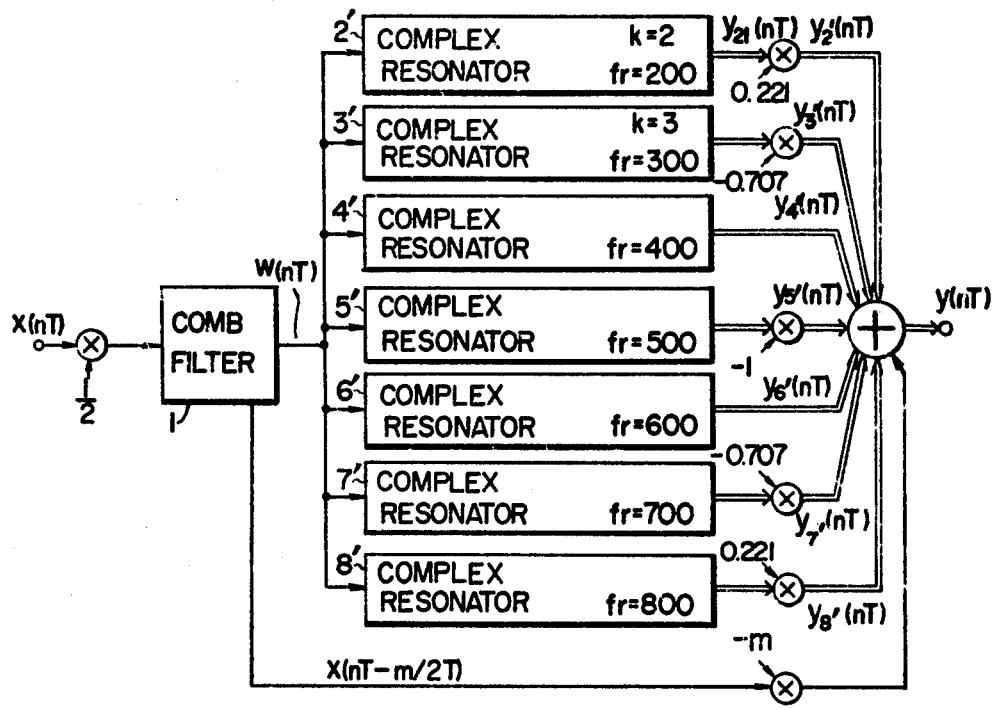

FREQUENCY SAMPLING FILTER

The present invention relates to frequency sampling filter and in particular to a frequency sampling filter adapted for the high pass type and the band stop type.

Figure 1A:
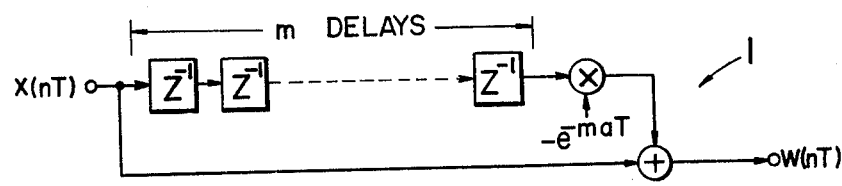
Figure 1B:
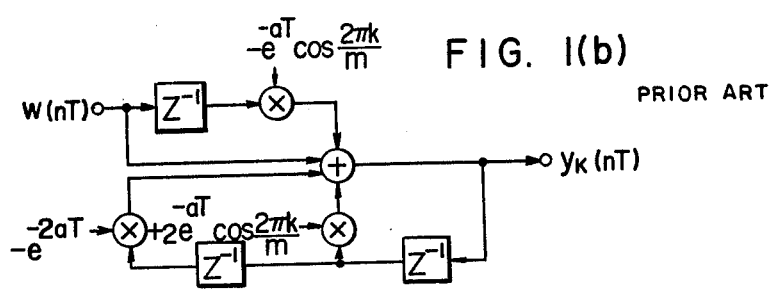
Figure 1C:
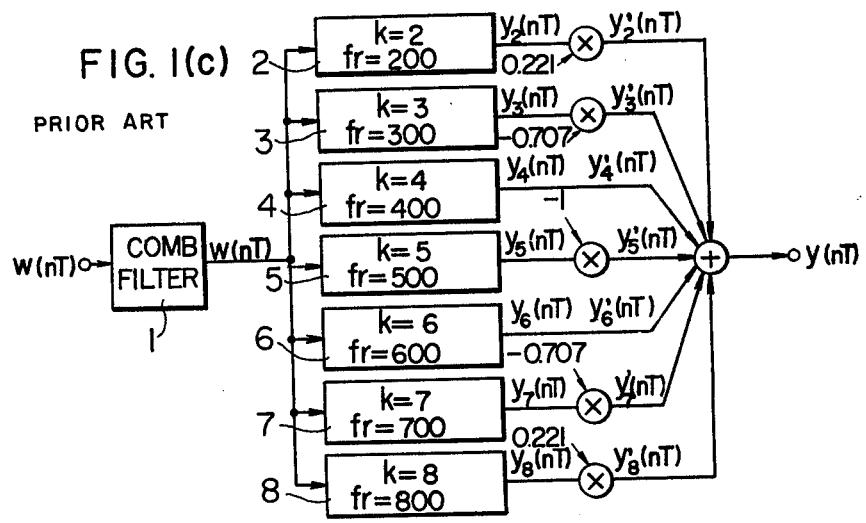

A frequency sampling filter according to the prior art is constituted as shown, for example, in FIG. 1. The transfer function of the circuit shown in FIG. 1(c) is represented in general by the following formula, $$H(Z) = (1 - e^{-maT}Z^{-m})$$
$$\times \sum_{k=r}^{S} \frac{1 - e^{-aT}\cos\frac{2\pi k}{m}Z^{-1}}{1 - 2e^{-aT}\cos\frac{2\pi k}{m}Z^{-1} + e^{-2aT}Z^{-2}} \times (-1)^K W_K \quad (1)$$

The above-described transfer function and the constitution shown in FIG. 1 are described in the article by C. M. Rader and B. Gold, entitled "Digital Filter Design Techniques in the Frequency Domain" in Proceedings IEEE, Vol. 55, No. 2 (February, 1967).

In the formula (1), Z is a complex operator such that the transfer function for a particular angular frequency $\omega$ can be obtained by calculating $H(e^{j\omega})$ with Z substituted by $Z = e^{j\omega t}$. Further, T is a sampling period.

A concrete circuit satisfying the formula (1) can be embodied as shown in FIG. 1(c). In FIG. 1(c), reference numeral 1 is a comb filter, and numerals 2, 3, 4, 5, 6, 7 and 8 are elemental filters. The concrete constitutions of the comb filter 1 and the elemental filters 2 to 8 are shown in FIG. 1(a) and (b), respectively.

In FIG. 1(a), $Z^{-1}$ signifies a delay element for providing a delay of one sampling period T, and symbols $\otimes$ and $\oplus$ signify a multiplier and an adder, respectively. The comb filter 1 has a transfer function $1 - e^{-maT}Z^{-m}$. Since $e^{-aT}$ can be made to have a value of nearly one, the transfer function can be nearly equal to $1 - Z^{-m}$. That is, the comb filter has m zeros such that $Z^m = 1$.

When $Z = e^{j(2\pi k/m)}$, that is, $\omega T = (2\pi k/m)$ $(k = 0, 1, \ldots, m-1)$, the transfer function of the comb filter 1 becomes zero. In terms of frequency $f$, the transfer function has m zeros when $f = \omega/2\pi = k/mT$ $(k = 0, 1, \ldots, m-1)$.

The elemental filters 2 to 8 have, as shown in FIG. 1(c), different $k$ values and thus the input coefficient to the multiplier $\otimes$ in FIG. 1(b) is different for each filter.

The coefficients of multiplication are different for respective elemental filters. The transfer functions of the respective elemental filters are $$\frac{1 - e^{-aT}\cos\frac{2\pi k}{m}Z^{-1}}{1 - 2e^{-aT}\cos\frac{2\pi k}{m}Z^{-1} + e^{-2aT}Z^{-2}},$$

Thus, the output $Y(nT)$ can be obtained by adding the outputs $Y_k(nT)$ of the elemental filters respectively multiplied by $(-1)^k \omega_k$. The value $(-1)^k$ is $+1$ for even $k$ while $-1$ for odd $k$. The coefficients $W_k$ are assumed to be 1 when $k = 4, 5$ or $6$; 0.707 when $k = 3$ or $7$; and 0.221 when $k = 2$ or $8$.

As described above, the transfer function of the formula (1) can be realized by the constitution shown in FIG. 1(c) in which the outputs of the series connections of the comb filter 1 and the bank of the elemental filters 2 to 8 are multiplied by coefficients to be added. Further, in the case of the circuit shown in FIG. 1(c), the constants in the formula (1) are selected in such a manner that $r = 2, s = 8, m = 124$, sampling period $T = 80.645$ $\mu$s and $e^{-aT} = 1 - 2^{-26}$.

The denominator of the transfer function of the formula (1) becomes nearly zero when $Z = e^{j(2\pi k/m)}$, that is, $\omega T = (2\pi k/m)$. This means that the gains of the elemental filters are very large when the frequencies are $f = \omega/2\pi = k/mT$. Since $m = 124$ and $T = 80,654$ $\mu$s, the resonance frequency $fr$ of each elemental filter is $fr = 100$ K(HZ). Thus, the resonance frequencies $fr$ of the elemental filters are, as shown in FIG. 1(c), 200, 300, 400, 500, 600, 700 and 800 HZ, respectively. On the other hand, the comb filter 1 has zeros at 0, 100, 200, 300, ..., and 12300 HZ. That is, the elemental filters 2 to 8 have poles such that the zeros of the comb filter 1 are cancelled.

Next, when $Z = e^{j(\omega t + \theta)}$ is substituted into the formula $$H_k(Z) = (1 - e^{-maT}Z^{-m})$$
$$\times \frac{1 - e^{-aT}\cos\frac{2\pi k}{m}Z^{-1}}{1 - 2e^{-aT}\cos\frac{2\pi k}{m}Z^{-1} + e^{-2aT}Z^{-2}} \quad (2)$$

and the limit for $\theta \to 0$ is calculated, the gains of the series connections of the comb filter 1 and the respective elemental filters at the resonance frequencies $fr$ are obtained to be $m/2$.

Figure 2:
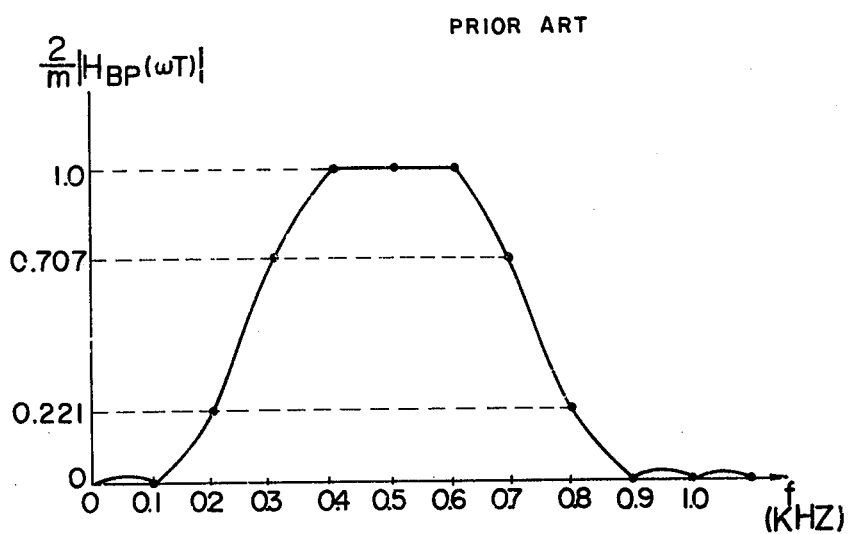

Thus, when the above-obtained gains are divided by $m/2$ to be normalized, the gains of the respective elemental filters at the corresponding resonance frequencies become unity. As a result, there are provided the amplitude versus frequency characteristics of the filter of FIG. 1 as shown in FIG. 2 and the phase characteristics as shown in FIG. 3. In particular, at 400 HZ, the elemental filter 4 has a gain of unity while the other elemental filters are of very small gain thus causing the entire gain to be unity. Similarly, at 500 and 600 Hz, the elemental filters 5 and 6 have, respectively, a gain of unit thus causing the entire gain to be unity. On the other hand, the entire gain is 0.707 at 300 and 700 Hz, 0.221 at 200 and 800 Hz. At 100, 0, 900, 1000, 1100, ... Hz, the entire gain is zero because there is provided no elemental filter having these frequencies as resonant frequencies. Further, at frequencies which are not multiples of 100 Hz, the gain has values on a curve formed by smoothly connecting these points.

Thus, a band pass filter can be designed which has an arbitrary bandwidth. Similarly, as is evident from FIG. 2, a low pass filter can be constituted by selecting the resonant frequencies at lower values. For example, by using five elemental filters having resonant frequencies at 0, 100, ... and 400 Hz, respectively, a low pass filter can be constituted.

However, when a band stop filter or a high pass filter is intended to be constituted according to the above-described manner, the number of the elemental filters is inevitably much increased because high frequencies must be made to pass through them. For example, if a band stop filter which has a gain of nearly one below 100 Hz and between 900 Hz and 11.5 KHz is to be formed according to the filter constitution of FIG. 1, fifty eight elemental filters are necessary.

Thus, in the constitution of the prior art, a great number of elemental filters are disadvantageously necessary for providing a high pass filter or a band stop filter.

FIGS. 1(a), (b) and (c) show the constitution, in the case of a band pass filter, of a frequency sampling filter according to the prior art.

Figure 5:
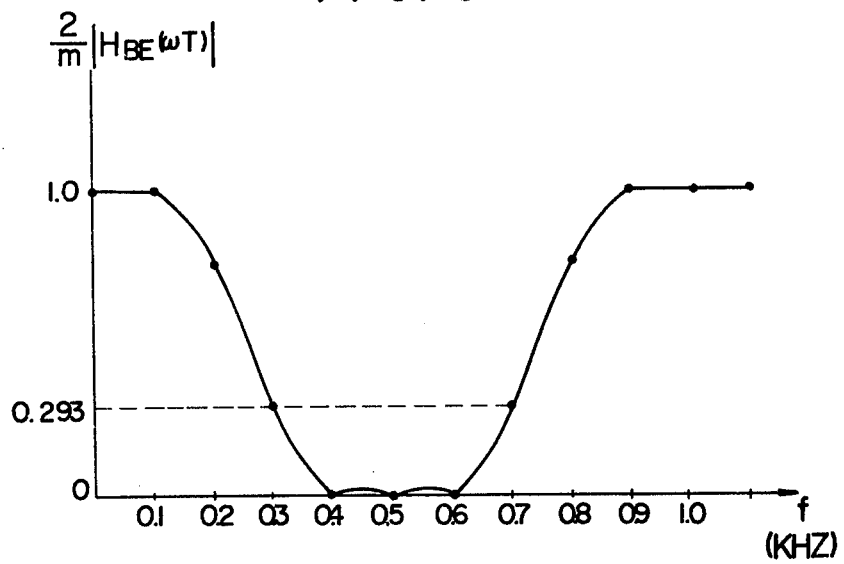
Figure 3A:
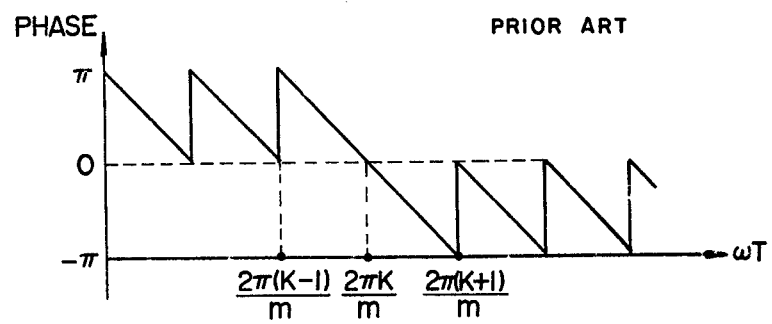
Figure 3B:
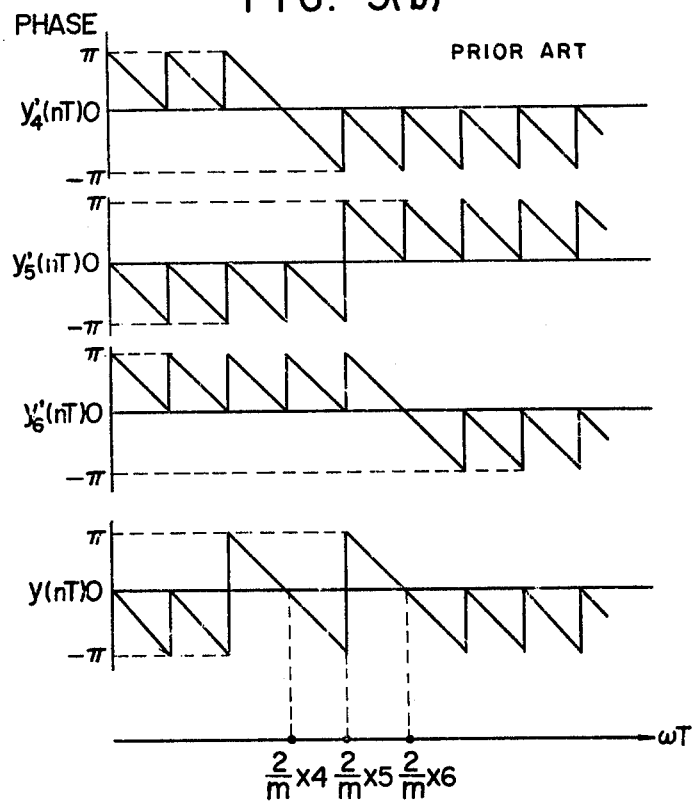
Figure 4A:
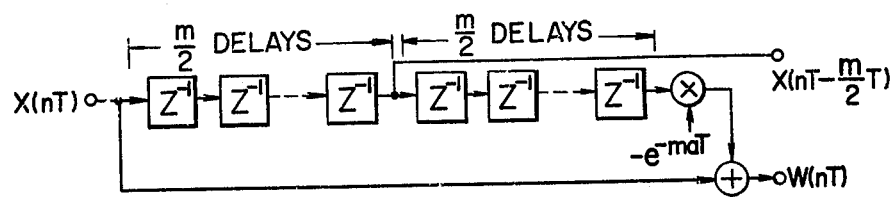
Figure 4B:
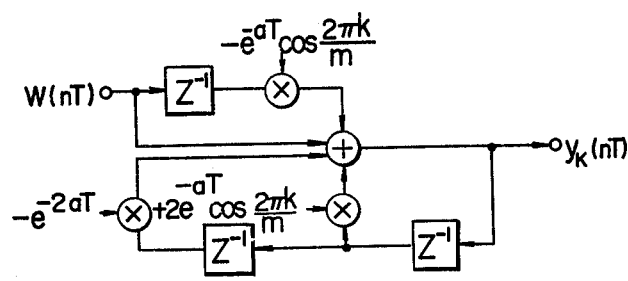
Figure 4C:
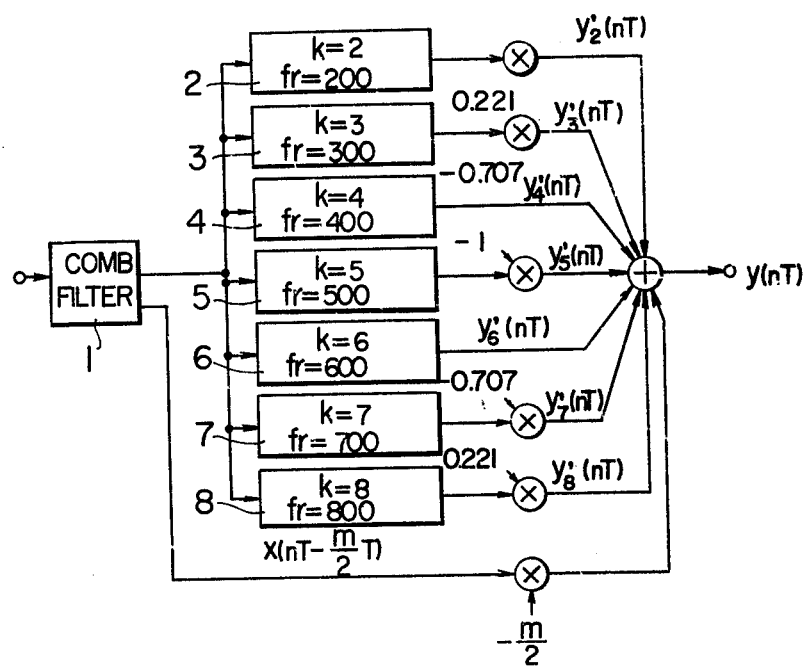
Figure 7:
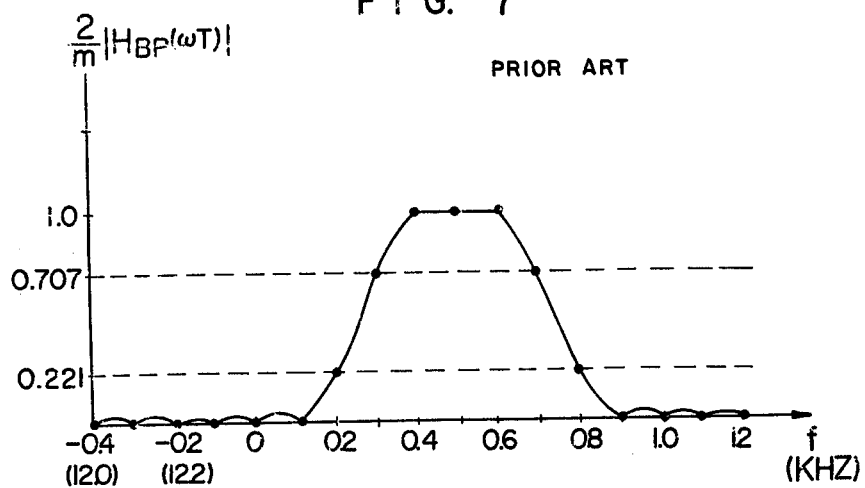
Figure 9:
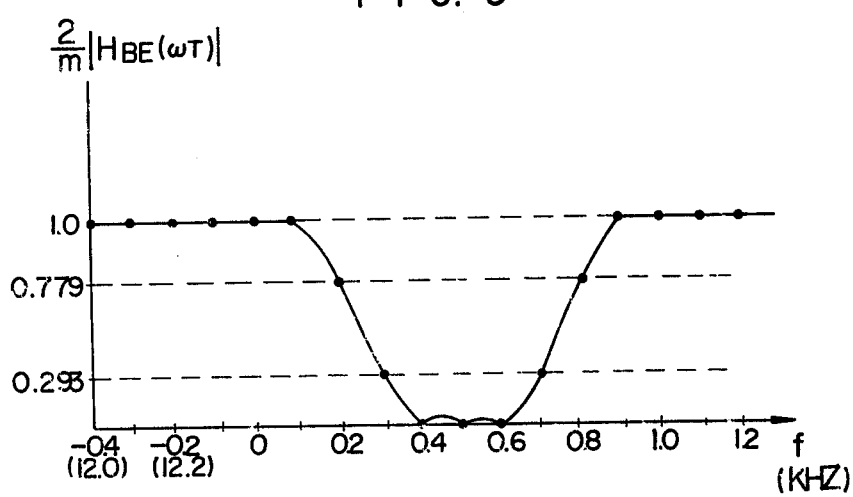

FIG. 2 shows the amplitude versus frequency characteristics of the filter shown in FIG. 1(c), FIGS. 3(a) and 3(b) show the phase characteristics of the filter shown in FIG. 1(c), FIGS. 4(a), (b) and (c) show the constitution, in the case of a band stop filter, of a frequency sampling filter according to the present invention, FIG. 5 shows the amplitude versus frequency characteristics of the filter shown in FIG. 4(c), FIGS. 6(a) and 6(b) show the constitution, in the case of a complex resonator and complex band pass filter, of a frequency sampling filter according to the prior art wherein FIG. 6(a) is a block diagram of a complex resonator, FIG. 6(b) is an entire block diagram of a complex band pass filter;

FIG. 7 shows the amplitude versus frequency characteristics of the filter shown in FIG. 6(a);

FIGs. 8(a) and 8(b) show other embodiments of the present invention in which FIG. 8(a) is a block diagram of a comb filter, FIG. 8(b) is an entire block diagram of a complex band stop filter; and FIG. 9 shows the amplitude versus frequency characteristics of the filter shown in FIG. 8(a).

The object of the present invention is to eliminate the disadvantage of the constitution according to the prior art, to make possible to constitute a high pass filter or a band stop filter with a small number of elemental filters, and to reduce substantially the number of multipliers, adders and delay elements as a whole.

Thus, in accordance with the present invention, the output of a band pass filter or a low pass filter is subtracted by the output of a circuit which has the same modulus as the gain at each sampling point in the pass band of the band pass filter or the low pass filter and a similarly varying phase to that in the pass band thereby to provide an output having the characteristics of a band stop filter or a high pass filter.

FIGS. 4(a), (b) and (c) show a first embodiment of the present invention, in which parts similar to those in FIGS. 1(a), (b) and (c) are designated by the same symbols.

The comb filter 1 in FIG. 4(a) is of the same constitution as the comb filter 1 in FIG. 1(a) except that the output is derived at the point after the $m/2$th of the $m$ delay elements $Z^{-1}$. Since this output has a delay of $m/2$ times the sampling period T, it can be represented by $x(nT - m/2T)$.

The elemental filters 2 to 8 in FIG. 4(b) are the same in constitution as the elemental filters in FIG. 1(b).

FIG. 4(c) is the same in configuration as FIG. 1(c) except that the output of the comb filter $x(nT - m/2\,T)$ is multiplied by $-m/2$ to be added to the adder. In the following, the characteristics of the filter shown in FIG. 4(c) will be described.

The transfer function of the series connection of the comb filter and one of the elemental filters is represented by the herein-before described formula (2). Putting $Z = e^{j\omega t}$ in the formula (2) and assuming $e^{-aT}$ being nearly unity.

$$H_k(e^{j\omega T}) = (1 - e^{-jm\omega T})$$

-continued $$x \left( \frac{1}{1 - e^{j\frac{2\pi k}{m}} e^{-j\omega T}} + \frac{1}{1 - e^{-j\frac{2\pi k}{m}} e^{-j\omega T}} \right)$$

Further, putting $\omega T = 2\pi i/m + \Delta$ (where, $i$ = integer, $0 < \Delta < 2\pi/m$), $$H_k(e^{j\omega T}) = (1 - e^{-jm\Delta})$$

$$x j \left\{ \frac{1}{\frac{2\pi(k-i)}{m} - \Delta} - \frac{1}{\frac{2\pi(k+i)}{m} + \Delta} \right\}$$

Since the second term in { } is negligible as compared with the first term, $$H_k(e^{j\omega T}) = j(1 - e^{-jm\Delta}) \times \frac{1}{\frac{2\pi(k-i)}{m} - \Delta}$$

The phase angle of $1 - e^{-jm\Delta}$ changes $\pi/2 \to 0 \to -\pi/2$ as $\Delta$ increases from zero to $2\pi/m$.

Thus, the phase angle of $H_k(e^{j\omega T})$ decreases as $\pi \to \pi/2 \to 0$ when $i < k$, while decreases as $0 \to -\pi/2 \to -\pi$ when $i \geq k$.

Accordingly, the phase angle of $H_k(e^{j\omega T})$ behaves with respect to $\omega T$ as shown in FIG. (a). Now, consider the elemental filters 4, 5 and 6 in FIG. 4(c), which have the same modulus of coefficient $W_k$ of unity. The phases of the outputs $Y'_4(nT)$, $y'_5(nT)$ and $y'_6(nT)$ are as shown in FIG. 3(b). In particular, $y'_4(nT)$ and $y'_6(nT)$ behave just in the same way as shown in FIG. 3(a), while $y'_5(nT)$ behaves with its phase inverted to that shown in FIG. 3(a) because of the factor $-1$ being multiplied to $y_k(nT)$.

The phase of the sum $y(nT)$ of $y'_4(nT)$, $y'_5(nT)$ and $y'_6(nT)$ behaves as shown in FIG. 3(b) since the phase characteristics of $y(nT)$ are dominated by the elemental filter the resonance frequency of which is the nearest to $\omega T$. That is, when $\omega T$ is between $2\pi/m \times 3$ and $2\pi/m \times 7$, the phase of $y(nT)$ varies just as $e^{-j(m/2)\omega T}$ does, or, in terms of the operator Z, just as $Z^{-m/2}$ does.

On the other hand, the circuit shown in FIG. 4(c) has the following transfer function, $$H(Z) = (1 - e^{-maT}Z^{-m}) \quad (3)$$

$$X \sum_{k=r}^{S} \frac{1 - e^{-aT}\cos\frac{2\pi k}{m}Z^{-1}}{1 - 2e^{-aT}\cos\frac{2\pi k}{m}Z^{-1} + e^{2aT}Z^{-2}} \times (-1)^K W_K - \frac{m}{2}Z^{-\frac{m}{2}}$$

The formula (3) has the form provided by reducing $(m/2\ Z^{-(m/2)}$ from the transfer function of the formula (1). This means that the output of the filter shown in FIG. 4(c) is equal to the difference between the output of the filter shown in FIG. 1(c) and the output of a circuit which is equal in gain to and varies in phase with the output at a sampling point in the pass band of the band pass filter shown in FIG. 1(c).

The gain of the circuit shown in FIG. 4(c) can be obtained from the formula (3). FIG. 5 shows the gain of the circuit of FIG. 4(c) as normalized by $m/2$. In particular, when the imput frequency $f$ is between 400 Hz and 600 Hz, that is, when $\omega T$ is between $(2\pi/m) \times 4$ and $(2\pi/m) \times 6$, the transfer function of the circuit shown in FIG. 1 has, as hereinbefore described, a modulus of $m/2$ and a phase varying as $Z^{-(m/2)}$ and thus gives approximately zero when $m/2\ Z^{-(m/2)}$ is subtracted therefrom. When the input frequency $f$ is below 100 Hz or above 900 Hz, the gain of the band pass filter is, as shown in FIG. 2, nearly zero and thus the transfer function of the band stop filter becomes, as is apparent from the formula (3), approximately $-(m/2)\ Z^{-(m/2)}$, that is, when normalized by $m/2$, the gain of the band stop filter is nearly unity as shown in FIG. 5.

Thus, the characteristics of a band stop filter can be provided by the circuit constitution shown in FIG. 4. It is also possible to provide the characteristics of a high pass filter by similarly modifying a low pass filter. Although, in the description above, $(m/2)\ Z^{-(m/2)}$ is subtracted from the output of a band pass filter or a low pass filter, on the contrary, the output of a band pass filter or a low pass filter may be subtracted from $(m/2)\ Z^{-(m/2)}$. In this case, the coefficients of the multipliers in FIG. 4 have to be inversed in sign and the transfer function has the form of the formula (3) with $(-1)$ multiplied on the right side. The transfer function of the formula (3) is changed only in its phase by 180° and thus the amplitude versus frequency characteristics remain unchanged as shown in FIG. 5.

Consequently, a band stop filter and a high pass filter can be constituted from a band pass filter and a low pass filter, respectively, having supplementary characteristics without adding a large number of elemental filters, that is, without adding further number of elemental filters and by adding only one multiplier.

For example, as described hereinbefore, when a band stop filter which has a gain of unity below 100 Hz and between 900 Hz and 11.5 KHz is intended to be constituted according to the prior art as shown in FIG. 1, fifty eight elemental filters are required, whereas, only seven elemental filters are sufficient for the constitution of the present invention as shown in FIG. 4.

Thus, an economical and compact filter can be constituted.

Further, on the contrary, it is possible also that a band stop filter and a high pass filter are constituted according to the prior art as shown in FIG. 1 thereby to manufacture a band pass filter and a low pass filter, respectively, according to the present invention as shown in FIG. 4. In this case, however, the present invention is meaningless unless the number of elemental filters in the band pass filter or the low pass filter is smaller in FIG. 4 than in FIG. 1, that is, the present invention is effective only when the band pass filter or the low pass filter which is to be realized has a pass band broader than the corresponding stop band.

Next, the present invention will be described with respect to a second embodiment. A conventional digital filter is used, just as an analogue filter, as a real filter having a real impulse response. In a real filter, the condition of symmetry on positive frequencies and negative frequencies is imposed. That is, the amplitude versus frequency characteristic has to be symmetric with respect to $f = 0$. As a result, assuming the sampling frequency of the digital filter to be $fs\ (= 1/T)$, the input frequencies $f$ of the filter have to satisfy the condition $f \leq fs/2$.

On the other hand, the concept of a complex filter is known. This is free from the condition of symmetry on positive and negative frequencies because of the multiplication coefficient being complex. The complex coefficient causes also the output signal to be complex. Thus, in the complex filter, the input signal frequencies $f$ suffice if only the condition $f \leq fs$ is satisfied and, when the range of the input signal frequencies $f$ is fixed, the sampling frequency $fs$ can be reduced by half as compared with the case of a real filter.

FIGS. 6(a) and (b) show an embodiment in which a complex band pass filter is constituted by means of a frequency sampling technique.

The transfer function of such a complex band pass filter is represented in general by the following formula.

$$H(Z) = \tfrac{1}{2}(1 - e^{-maT}Z^{-m}) \sum_{k=p}^{q} (-1)^k \cdot \frac{W_k}{1 - e^{-aT}e^{j\frac{2\pi k}{m}}Z^{-1}} \quad (4)$$

The factor $\tfrac{1}{2}$ serves to give the same gain at poles as in the formula (1) and may be omitted. The transfer function $$\frac{1}{1 - e^{j\frac{2\pi k}{m}} \cdot Z^{-1}}$$

of complex resonators $2'$ to $8'$ in the formula (4) can be transformed to give the real part Hreal(Z) and the imaginary part Himag(Z) as follows:

$$\text{Hreal}(Z) = \frac{1 - e^{-aT}\cos\frac{2\pi k}{m} \cdot Z^{-1}}{1 - 2e^{-aT}\cos\frac{2\pi k}{m} \cdot Z^{-1} + e^{-2aT} \cdot Z^{-2}}$$

and $$\text{Himag}(Z) = \frac{e^{-aT}\sin\frac{2\pi k}{m} \cdot Z^{-1}}{1 - 2e^{aT}\cos\frac{2\pi k}{m} \cdot Z^{-1} + e^{-2aT} \cdot Z^{-2}}$$

It is evident in view of the equations above that a complex resonator can be provided by the constitution shown in FIG. 6(a). Further, a band pass filter which has a passband of 400 to 600 Hz can be formed by employing seven such complex resonators as shown in FIG. 6(b). The comb filter in FIG. 6(b) is the same as that in FIG. 1(a).

In FIG. 6(b), the constants of the formula (4) are selected in such a manner that $m = 124$, sampling period $T = 80.645\ \mu s$, and $e^{-aT} = 1 - 2^{-26}$. The filter in FIG. 6(b) has a gain of approximately zero in the range of $-600$ to $-400$ Hz (that is, 11.8 to 12.0 KHz), which is different from the case of FIG. 1 and is a feature of a complex filter. FIG. 7 shows the amplitude versus frequency characteristics of the filter shown in FIG. 6(b). When the concept of the present invention is applied to such a complex frequency sampling filter, a band pass type complex filter or a high pass type complex filter can be obtained just as in the case of a real filter.

For example, the transfer function of a band stop filter is represented as follows:

$$H(Z) = \frac{m}{2} \cdot Z^{-\frac{m}{2}} + \frac{1}{2}(1 - e^{-maT}Z^{-m}) \sum_{k=p}^{q} (-1)^k \cdot \quad (5)$$

-continued $$\frac{W_k}{1-e^{-aT}e^{j\frac{2\pi k}{m}} \cdot Z^{-1}}$$

Since the transfer function of the formula (4) has the values of nearly $(m/2)Z^{-(m/2)}$ in the pass band and nearly zero in the stop band, the transfer function of the formula (5) which is formed by subtracting $(m/2) \cdot Z^{-(m/2)}$ has the values of nearly zero and nearly $-(m/2) \cdot Z^{-m/2}$ in the respective bands. That is, the pass band of a bandpass filter is made to be the stop band. FIGS. 8(a) and (b) show the constitution as an embodiment of a complex band stop filter according to the formula (5). The complex resonator in FIG. 8(a) is the same in constitution as that in FIG. 6(a). The output $x$ $(nT=mT/2)$ picked up in the comb filter is multiplied by $-m$ instead of $-(m/2)$ as in the case of FIG. 4 because a factor of ½ has been multiplied before the comb filter. FIG. 9 shows the amplitude versus frequency characteristics of the filter shown in FIG. 8. If a band pass filter having the characteristics as shown in FIG. 9 is intended to be formed by means of the constitution as shown in FIG. 6, 121 complex resonators are necessary. However, if by means of the constitution as shown in FIG. 8, only seven complex resonators suffice.

Similarly, it is possible to derive a complex high pass filter from a complex low pass filter. Further, it is also possible that a band stop filter and a high pass filter are constituted according to the prior art as shown in FIG. 6 and then a band pass filter and a low pass filter are respectively derived therefrom. However, this is advantageous, as in the case of a real filter, only when the band pass filter or the low pass filter which is to be derived has a pass band broader than the stop band.

As described above, in accordance with the present invention, there is provided an economical and compact filter not only in the case of real but also in the case of complex.

What we claim is:

1. A frequency sampling filter comprising:
   first filter means having an input for receiving an input signal and first and second outputs, the transfer function between said input and said first output having a plurality of periodically spaced zeros, said second output providing an output of the input signal delayed by a predetermined time;
   second filter means coupled to said first output of said first filter means and including a plurality of resonator circuits providing outputs, each of said resonator circuits having a predetermined number of poles in the transfer characteristics thereof, the poles of each of said resonator circuits being coincident in frequency with a separate one of the periodically spaced zeros of said first filter means; and
   summation means coupled to each of said resonator circuits and said second output of said first filter means for summing the outputs thereof to form a composite output signal.

2. A frequency sampling filter according to claim 1, further comprising:
   a plurality of first multiplier means corresponding in number to said plurality of resonator circuits, each of said first multiplier means being coupled between a separate one of said resonator circuits and said summation means for providing multiplied outputs of said resonator circuits to said summation means; and
   second multiplier means coupled between said second output of said first filter means and said summation means for providing a multiplied output of said second output of said first filter means to said summation means, whereby the outputs of said resonator circuits and said second output of said first filter means summed by said summing means are multiplied outputs.

3. A frequency sampling filter according to claim 2, wherein at least one of said first multiplier means has a unity multiplication factor and at least another of said first multiplier means has a non-unity multiplication factor.

4. A frequency sampling filter according to claim 1, wherein said first filter means includes:
   a first delay circuit having an input coupled to said input of said first filter means and an output coupled to said second output of said first filter means, said first delay circuit providing an output of the input signal delayed by the predetermined time to said second output of said first filter means;
   a second delay circuit having an input coupled to the output of said first delay circuit for providing a delayed signal at the output thereof;
   a multiplier circuit having an input coupled to the output of said second delay circuit for multiplying the delayed signal from said second delay circuit by a predetermined factor to form a delay product signal at the output thereof; and
   a summation circuit having inputs coupled to the input of said first delay circuit and the output of said multiplier circuit and an output coupled to said first filter means for supplying an output signal thereto.

5. A frequency sampling filter according to claim 1, further comprising multiplier means coupled between said second output of said first filter means and said summation means for supplying a multiplied output of said second output of said first filter means for summing by said summation means.

6. A frequency sampling filter according to claim 5, further comprising a plurality of other multiplier means corresponding in number to said plurality of resonator circuits, each of said other multiplier means being coupled between a separate one of said resonator circuits and said summation means for providing multiplied outputs of said resonator circuits to said summation means, whereby the outputs of said resonator circuits and said second output of said first filter means summed by said summing means are multiplied outputs.

7. A frequency sampling filter according to claim 6, wherein said first filter means includes:
   a first delay circuit having an input coupled to said input of said first filter means and an output coupled to said second output of said first filter means, said first delay circuit providing an output of the input signal delayed by the predetermined time to said second output of said first filter means;
   a second delay circuit having an input coupled to the output of said first delay circuit for providing a delayed signal at the output thereof;
   a multiplier circuit having an input coupled to the output of said second delay circuit for multiplying the delayed signal from said second delay circuit by a predetermined factor to form a delay product signal at the output thereof; and
   a summation circuit having inputs coupled to the input of said first delay circuit and the output of said multiplier circuit and an output coupled to said first filter means for supplying an output signal thereto.

8. A frequency sampling filter according to claim 6, further comprising additional multiplier means for receiving the input signal and supplying a multiplied input signal to said input of said first filter means, said first filter means including a comb filter and said resonator circuits of said second filter means being complex resonator circuits.

* * * * *